United States Patent
Javanifard et al.

(12) 
(10) Patent No.: US 6,275,422 B1
(45) Date of Patent: Aug. 14, 2001

(54) CONSTANT CURRENT AND VOLTAGE METHOD AND APPARATUS

(75) Inventors: Jahanshir J. Javanifard, Sacramento; Hari Giduturi, Folsom, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,489

(22) Filed: Dec. 30, 1999

(51) Int. Cl.[7] .................................................. G11C 7/00
(52) U.S. Cl. ...................... 365/189.07; 327/512
(58) Field of Search .................. 365/189.07; 327/512, 327/513, 538–541

(56) References Cited

U.S. PATENT DOCUMENTS

| | | | |
|---|---|---|---|
| 4,935,914 | * 6/1990 | Morita et al. | 369/54 |
| 5,946,258 | 8/1999 | Everett et al. | 365/226 |
| 6,055,489 | 4/2000 | Beatty et al. | 702/130 |

* cited by examiner

*Primary Examiner*—David Nelms
*Assistant Examiner*—M. Tran
(74) *Attorney, Agent, or Firm*—Blakely, Sokoloff, Taylor & Zafman LLP

(57) ABSTRACT

A signal generator in an integrated circuit includes circuitry to generate an output signal based on a supply signal and a difference between a first reference value and a second reference value. The output signal has an output signal variation due to at least one of a process variation, a temperature variation, and a variation in the supply signal. A first reference device provides the first reference value based on an input signal. A second reference device provides the second reference value based on the input signal. The second reference value can be any one of a plurality of selectable reference values. At least one of the plurality of selectable reference values reduces the output signal variation.

23 Claims, 8 Drawing Sheets

STORAGE
MEDIUM 810

MACHINE
EXECUTABLE
INSTRUCTIONS
825

FIG. 8

CONSTANT CURRENT AND VOLTAGE METHOD AND APPARATUS

FIELD OF THE INVENTION

The present invention relates to integrated circuits. In particular, the present invention relates to constant voltage and current generators in integrated circuits.

BACKGROUND OF THE INVENTION

Constant voltage and current generators are used in many different ways in integrated circuits. For instance, constant voltages and currents are used as references to accurately generate various signals and to measure various parameters within integrated circuits. Flash electrically erasable programmable read only memory (EEPROM) is one example of an integrated circuit technology that often relies on constant voltage generation. Other examples include analog to digital converts, digital to analog converts, and virtually any precision analog circuit.

In flash EEPROM, cells of memory are erased using a relatively large voltage compared to voltage levels normally available in integrated circuits. For instance, a normally available voltage in an integrated circuit may be 1.55 volts, but cells of flash memory may require 12 volts to erase the cells. A charge pump is used to generate the required 12 volts using the available 1.55 volts. Simply amplifying the available voltage, however, would also amplify any variation in the available voltage. That is, if the available voltage is 1.55 volts plus or minus five percent, the amplified voltage would be 12 volts plus or minus five percent. The voltage needed to erase flash cells often needs to be fairly accurate. If the voltage is too large, it is likely to exceed the break down voltage for the flash cells, potentially causing permanent damage. If the voltage is too small, it may not reliably erase the cells. Whereas a five percent variation on 1.55 voltages may be acceptable, five percent of 12 volts may not be acceptable. Therefore, in order to generate a more accurate voltage, a charge pump relies on a reference voltage provided by a constant voltage generator.

Several types of constant voltage and current generators are known in the art. FIG. 1 illustrates one example of a constant voltage generator 100. Operational amplifier 110 is powered by source voltage 170. Based on source voltage 170 and the voltage differential between the positive and negative terminals, operational amplifier 110 generates reference voltage 120. The voltage differential between the terminals is equal the voltage differential between nodes 135 and 145. The voltage differential depends on the voltage through feedback loop 180 (which is reference voltage 120), resistors 130 and 140, and diodes 150 and 160. In other words, as long as source voltage 170, and the voltages across resistors 130 and 140, and diodes 150 and 160, remain constant, reference voltage 120 will remain constant.

Unfortunately, source voltage 170, the voltage across resistors 130 and 140, and diodes 150 and 160, cannot be relied upon to remain constant. For instance, the values change with temperature. The values also change from one integrated circuit to the another due to process variation in manufacturing, especially if two integrated circuits are from different runs of the manufacturing process. As a result, the reference voltage 120 will vary due to temperature variation, process variation, and source voltage variation.

As integrated circuit technology continues to move toward smaller integration, voltage tolerance levels also continue to decrease, making reliable reference signals increasingly more important.

SUMMARY OF THE INVENTION

A signal generator in an integrated circuit includes circuitry to generate an output signal based on a supply signal and a difference between a first reference value and a second reference value. The output signal has an output signal variation due to at least one of a process variation, a temperature variation, and a variation in the supply signal. A first reference device provides the first reference value based on an input signal. A second reference device provides the second reference value based on the input signal. The second reference value can be any one of a plurality of selectable reference values. At least one of the plurality of selectable reference values reduces the output signal variation.

BRIEF DESCRIPTION OF THE DRAWINGS

Examples of the present invention are illustrated in the accompanying drawings. The accompanying drawings, however, do not limit the scope of the present invention. Similar references in the drawings indicate similar elements.

FIG. 8 illustrates one embodiment of machine executable instructions stored on a machine readable storage medium according to the present invention.

DETAILED DESCRIPTION

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

Various operations will be described as multiple discrete steps performed in turn in a manner that is helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

Figures 2A, 2B:
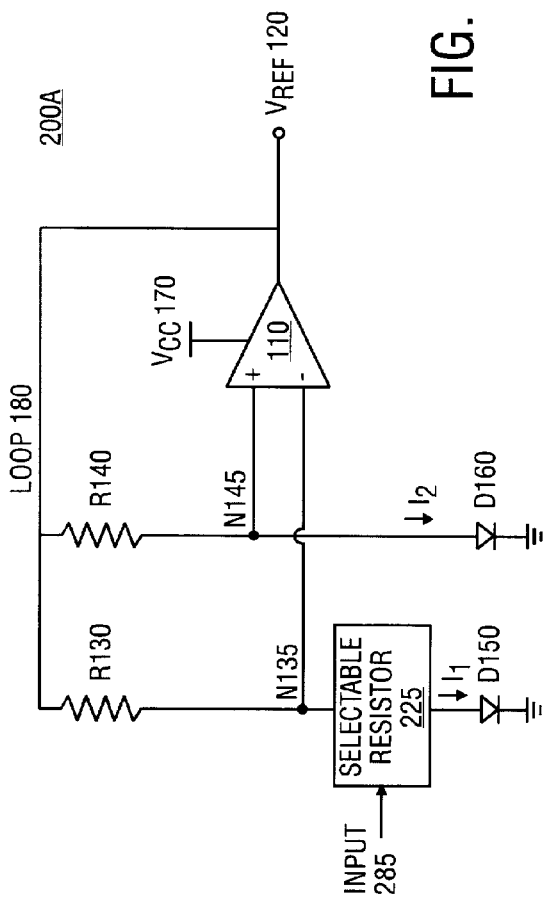
FIG. 2A illustrates one embodiment of a constant voltage generator according to the teachings of the present invention.
FIG. 2B illustrates one embodiment of a constant current generator according to the teachings of the present invention.

The present invention provides a signal generator to produce a constant current or voltage having reduced susceptibility to signal variation due to temperature change, manufacturing process variation, and source voltage variation in an integrated circuit. Signal variation is reduced by matching component values within the signal generator so as to counteract signal variation. FIGS. 2A and 2B illustrate two embodiments of the present invention.

Figure 1:
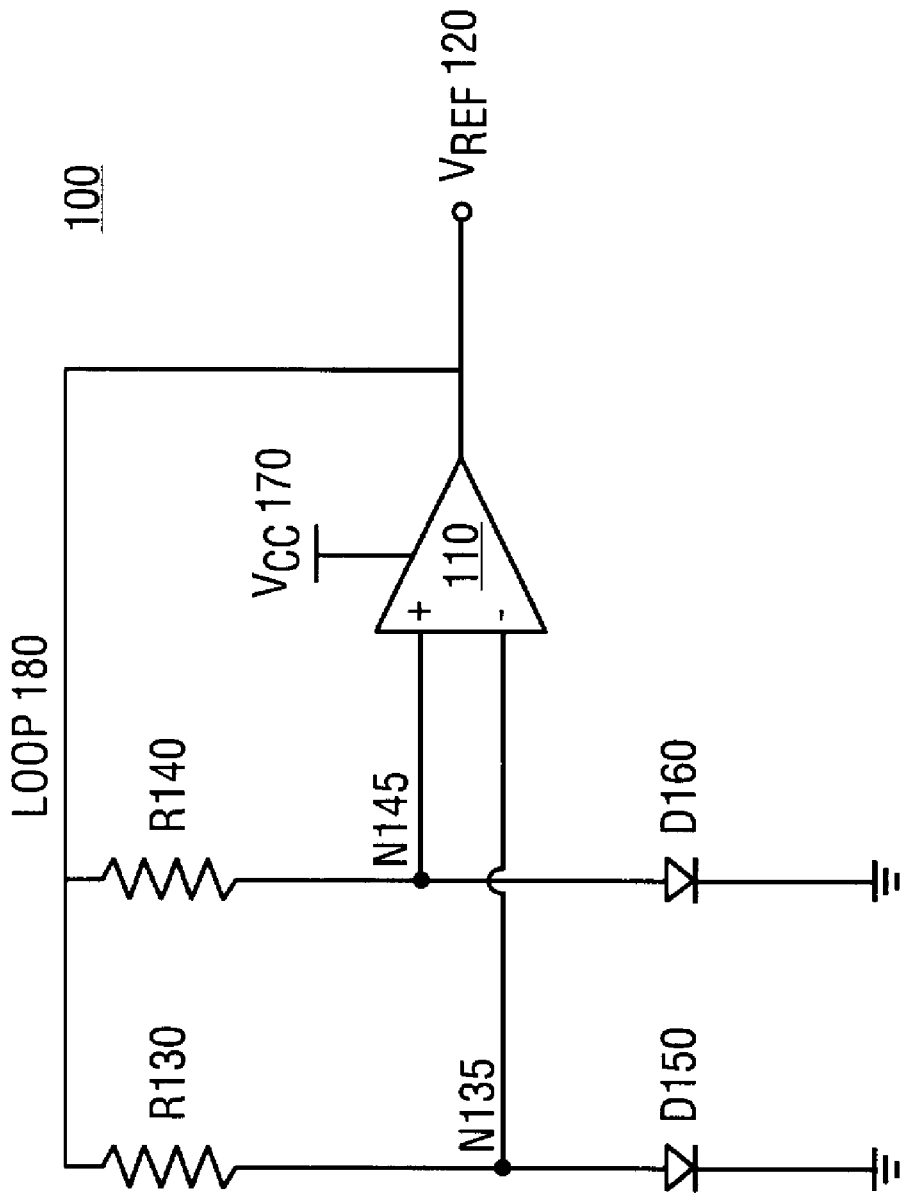
FIG. 1 illustrates one embodiment of constant voltage generator according to the prior art.

In FIG. 2A, a constant voltage generator 200A is implemented in an integrated circuit. In one embodiment, the integrated circuit is a flash electrically erasable programmable read only memory (EEPROM), such as a flash memory to store a basic input/output system (BIOS) for a microprocessor. Constant voltage generator 200A is similar to constant voltage generator 100 from FIG. 1 with the exception of selectable resistor 225 and input signal 285. The reference voltage 120 is generated based on source voltage 170 and the voltage differential between nodes 135 and 145. The voltage at node 145 is equal the voltage across diode 160. The voltage at node 135 is equal to the voltage across selectable resistor 225 and diode 150.

The characteristics of resistors 130 and 140, and diodes 150 and 160, vary with changes in temperature. In general, the voltage across a resistor having a positive temperature coefficient increases as temperature increases, and the voltage across a diode decreases as temperature increases. The present invention takes advantage of this inverse relationship of resistors and diodes to temperature. Specifically, selectable resistor 225 is included in constant voltage generator 200A so as to counteract the temperature effects on diodes 150 and 160.

For example, if the resistance of selectable resistor 225 is matched to the diodes such that the change in voltage across diode 160 due to temperature is equal to the change in voltage across diode 150 and resistor 225 due to temperature, then the voltage difference between nodes 135 and 145 will remain constant with respect to temperature, and reference voltage 120 will therefore remain constant with respect to temperature.

The voltage across diodes 150 and 160, respectively, can be represented by the following equations:

$$V_{D150} = \frac{kT}{q}\text{Ln}\left(\frac{I_1}{I_{1500}}\right),$$

$$V_{D160} = \frac{kT}{q}\text{Ln}\left(\frac{I_2}{I_{1600}}\right),$$

where:
k=Boltzman's constant=1.38×10$^{-23}$ Joules/Kelvin,
q=the magnitude of electronic charge=1.6×10$^{-19}$ Joules/Volt,
T=absolute temperature in Kelvin,
I=current as a function of temperature,
$I_{1500}$=the reverse saturation current for diode 150, and
$I_{1600}$=the reverse saturation current for diode 160.
In which case, the voltage across resistor 225 can be represented as:

$$V_{R225} = V_{D160} - V_{D150} = \frac{kT}{q}\text{Ln}\left(\frac{I_2}{I_{1600}}\right) - \frac{kT}{q}\text{Ln}\left(\frac{I_1}{I_{1500}}\right),$$

$$V_{R225} = \frac{kT}{q}\left(\text{Ln}\left(\frac{I_2}{I_{1600}}\right) - \text{Ln}\left(\frac{I_1}{I_{1500}}\right)\right) = \frac{kT}{q}\text{Ln}\left(\frac{A_{D150}}{A_{D160}}\right),$$

where:
$A_{150}$ equals the area of diode 150, and
$A_{160}$ equals the area of diode 160.

The voltages across selectable resistor 225 and diodes 150 and 160 all vary with respect to temperature. Through any number of mathematical techniques, a value for resistor 225 at room temperature can be selected such that the increase in voltage across resistor 225 with respect to temperature largely counteracts the decrease in voltages across diodes 150 and 160 with respect to temperature over a range of operating temperatures.

Signal variation, however, is also due to process variation and source voltage variation. The accuracy of the manufacturing process is limited, leading to process variation. As layers of material are grown and etched away on a silicon wafer, there are small variations in chemical concentrations, the duration of light exposure, etc. Even if values for selectable resistor 225 and diodes 150 and 160 are mathematically matched as discussed above, process variation and variation in source voltage will produce variation in reference voltage 120 from one integrated circuit to another integrated circuit at a given temperature. For instance, if the voltage increase due to process variation across selectable resistor 225 can vary plus or minus 5%, and the voltage decrease due to process variation across diodes 150 and 160 can vary plus or minus 5%, the variation of reference voltage 120 may vary plus or minus 10% from one voltage generator 200A to another voltage generator 200A.

Figure 3:
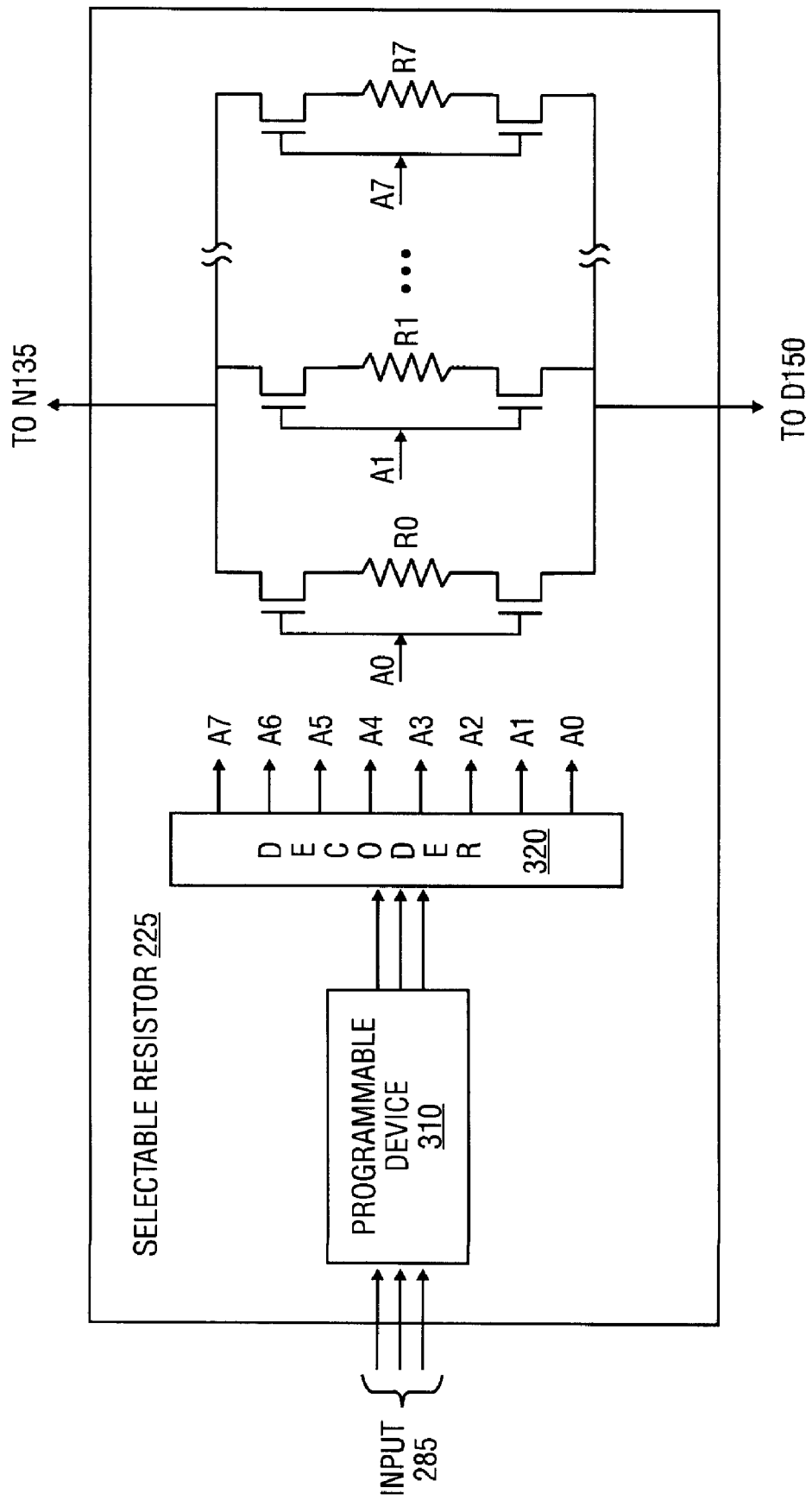
FIG. 3 illustrates one embodiment of the selectable resistor.

The present invention, however, reduces susceptibility due to process variation and source voltage variation by selecting a resistor value to be used in selectable resistor 225 from an array of resistor values based on input 285. For instance, FIG. 3 illustrates one embodiment of selectable resistor 225 having eight possible resistor values, R0 to R7. In alternate embodiments, any number of resistor values can be included in selectable resistor 225, such as 32, 64, or 128 resistors, and need not be a modulo of 2.

In the illustrated embodiment, input 285 is a three bit value. Each unique three bit input is decoded by decoder 320 to select one of the resistors, R0 to R7. As discussed below, input 285 can be changed to search for a resistor that adequately reduces signal variation in the reference voltage produced by the constant voltage generator. If a resistor is found, the unique three bit input 285 corresponding to that resistor is programmed into device 310. For instance, in one embodiment, programmable device 310 is a one-time programmable device such as content addressable memory (CAM) cells implemented, for example, in flash memory, or an array of fuses. In alternate embodiments, programmable device 310 need not be on the same chip as selectable resistor 225, and need not be integrated in flash memory at all. For instance, programmable device 310 can be located virtually anywhere and take virtually any form as long as it provides the appropriate input 285 for the selected resistor value.

In one embodiment, all of the resistors are designed to have the same resistance value that mathematically matches to the designed diodes as discussed above. In which case, the only variation from one resistor to another is due to process variation. In alternate embodiments, the resistors are designed to have resistance values over a range of values likely to mathematically match with the range of possible diode values.

Returning to FIG. 2B, constant current generator 200B is similar to constant voltage generator 200A of FIG. 2A with the exception of transistors 630 and 640. Constant current generator 200B is configurable much like constant voltage generator 200A. Constant voltage generator 200A was configured to have a constant voltage differential at the in put terminals of operational amplifier 110 to produce a constant voltage. Constant current generator 200B is configured to have a constant current through each of transistors 630 and 640 to produce a constant current at output 220. The currents need not be equal as long as the difference between the currents remains constant. To achieve constant currents, selectable resistor 625 has the added requirement of having a particular temperature coefficient, $\alpha$.

Expressing the equation for selectable resistor 625 in terms of current:

$$V_{R625} = I_1 R_{625} = \frac{kT}{q} \text{Ln}\left(\frac{A_{D150}}{A_{D160}}\right),$$

$$I_1 = \frac{kT}{R_{625}q} \text{Ln}\left(\frac{A_{D150}}{A_{D160}}\right).$$

Substituting $R_{625}$ for the equation for resistivity as a function of temperature:

$$I_1 = \frac{kT}{q(R_{625O}(1 + \alpha(T - T_0)))} \text{Ln}\left(\frac{A_{D150}}{A_{D160}}\right).$$

Taking the partial derivative of current with respect to temperature, and setting equal to zero:

$$0 = \frac{\partial I_1}{\partial T} = \frac{k}{qR_{625O}} \text{Ln}\left(\frac{A_{D150}}{A_{D160}}\right)\left(\frac{1}{(1 + \alpha(T - T_0))} - \frac{T\alpha}{((1 + \alpha(T - T_0))^2}\right).$$

Collecting like terms and rearranging with respect to $\alpha$:

$$\alpha = \frac{1}{T_O} = \frac{1}{300 \text{ Kelvin}} = 3333.33 \text{ ppm}.$$

That is, the temperature coefficient for selectable resistor 625 should be 3333.33 parts per million (ppm) in order to generate a constant current for a temperature range having a reference temperature of 300 Kelvin. The reference temperature, in one embodiment, is a temperature at the middle of an anticipated range of operating temperatures. In general, the temperature coefficient should be the inverse of the reference temperature.

The above solution for the temperature coefficient is referred to as a "first order solution." It is only reliable up to a certain level of accuracy. Those skilled in the art will recognize that a solution is needed for multiple temperature coefficients for a wider range of temperatures or a higher level of accuracy. A solution can be calculated using a higher order equation for the resistivity of $R_{625}$. For instance, a more accurate equation for resistivity is:

$$R_T = R_o(1 + \alpha T + \beta T^2 + \gamma T^3),$$

where $\beta$ and $\gamma$ are additional coefficients.

The first order solution (the inverse of the reference temperature) is usually adequate for applications having an accuracy level of about 16 to 20 bits. A higher order solution may be needed for applications having an accuracy in the range 30 or 40 bits.

Figure 4:
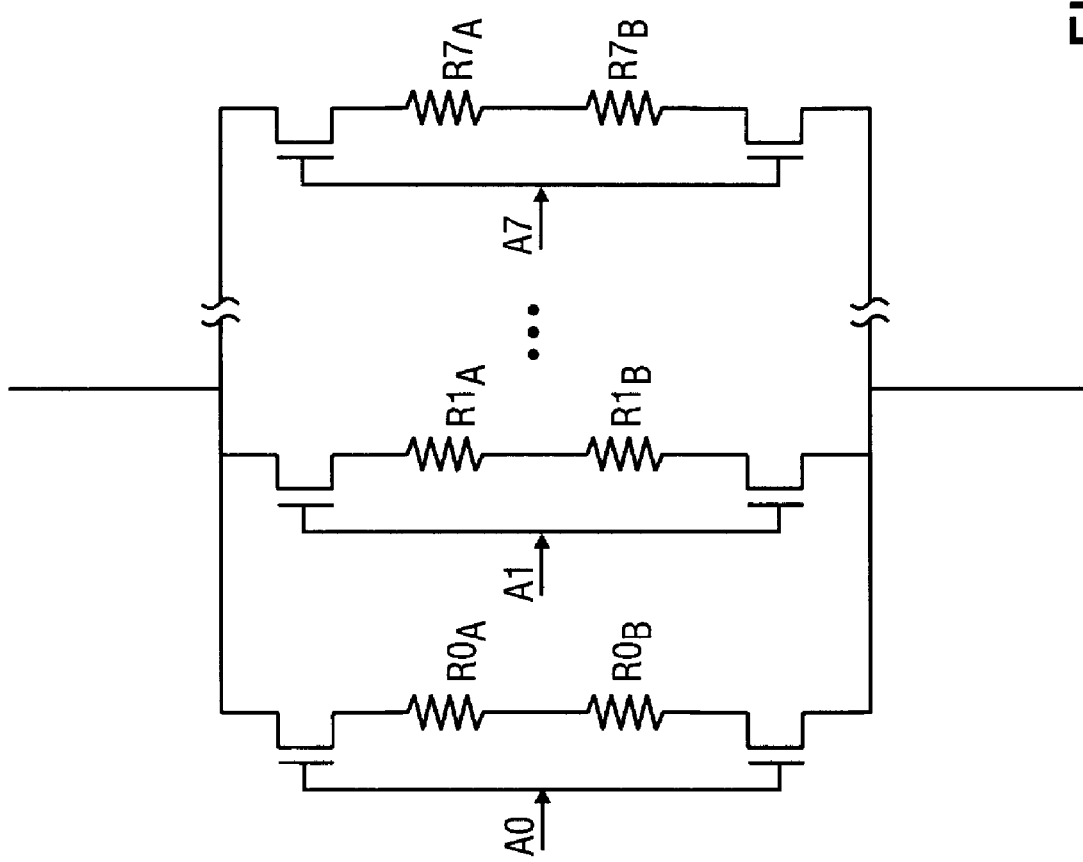
FIG. 4 illustrates another embodiment of the selectable resistor.

In most integrated circuit technologies, a resistor with a temperature coefficient of 3333.33 ppm is not readily available. As illustrated in FIG. 4, the selectable resistor 625 includes a parallel array of resistors that combine two resistors in series, an A resistor component and a B resistor component. To achieve the desired temperature coefficient, a resistor component having a temperature coefficient that is higher than the inverse of the reference temperature is combined with a resistor component having a temperature coefficient that is lower than the inverse of the reference temperature. For instance, in one embodiment, an N-well resistor component with a positive temperature coefficient on the order of 5000 ppm is combined with a poly-1 resistor component with a negative temperature coefficient on the order of −2000 ppm. Any number of mathematical techniques can be used to determine appropriate combinations of the two resistor components to achieve the desired temperature coefficient of the inverse of the reference temperature, 3333.33 ppm in the illustrated example. As with constant voltage generator 200A, process variation introduces deviation from the mathematically matched components, so an array of available components is provided from which to choose. If an adequate resistor combination is found, the corresponding input 285 can be programmed as discussed above.

Figure 5:
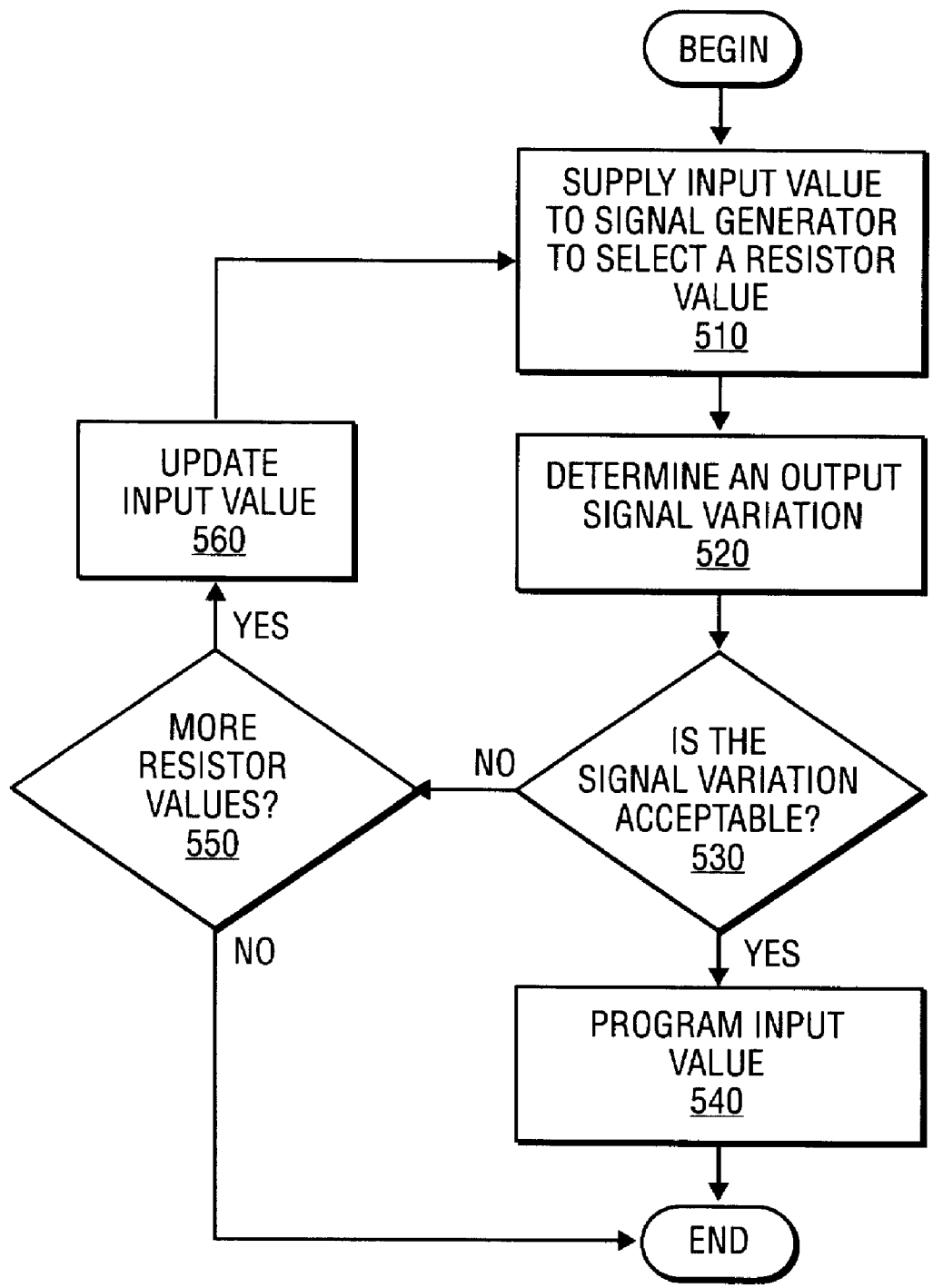
FIG. 5 demonstrates a process of one embodiment of the present invention.

FIG. 5 illustrates one embodiment of the present invention to select the appropriate input value 285 for constant voltage generator 200A or constant current generator 200B. In block 510, an input value is supplied to the signal generator. In block 520, an output signal variation is determined in any of a number of possible ways. For instance, in one embodiment, the output voltage or current of the constant signal generator is measured at two temperatures and compared to some external reference signal. In another embodiment, the output signal is measured at two temperatures without comparison to an external reference signal. In yet another embodiment, the output signal is measured at more than two temperatures. In block 530, if the variation is within acceptable limits, the input value is programmed in block 540.

Variations between integrated circuits taken from the same silicon wafer are usually small compared to variations between circuits taken from different silicon wafers. In which case, in one embodiment, it may be more cost effective to simply test one signal generator from each wafer and then set all signal generators in integrated circuits on the same wafer with the same input value.

As circuit integration continues to become smaller, the signal generators may need to be tuned more finely. In which case, more than one signal generator can be tested per wafer. For instance, in one embodiment, process variation depends on radial distance from the center of a die on a wafer. In which case, one signal generator may be tested for those generators located in a region near the edge of a die, one signal generator may be tested for those generators located in a region at the center of a die, and one signal generator may be tested for those generators located between the center region and the edge region of a die.

If, in block 530, the signal variation is not acceptable, the process determines whether or not more resistor values are available for testing in block 550. For instance, the total number of available resistor values may be known, and the number of iterations through the testing process may be tracked and compared to the number of available resistors. If all of the resistor values have been tested without producing an acceptable signal variation, the process ends.

If, in block 550, more resistor values are left for testing, the input value is updated in block 560, and the process returns to block 510 for another iteration. In one embodiment, the first input value is all zeros, and the input value is merely incremented for each iteration through the process. In alternate embodiments, any number of search techniques can be used.

For instance, resistor values may be designed to sequentially range from a low value to a high value. In which case, a binary search method may start with a middle input value, and either increase or decrease half way up or down the remaining range of values for each iteration through the process depending on the signal variation until the best possible value is located. In which case, at step 550, rather than comparing the number of iterations to the number of available resistor values, no more resistor values are available when the best possible value does not produce an acceptable signal variation.

In another embodiment, all of the resistor values can be tested and the results for each test stored so that an input value corresponding to the best test results can be selected.

Figure 6:
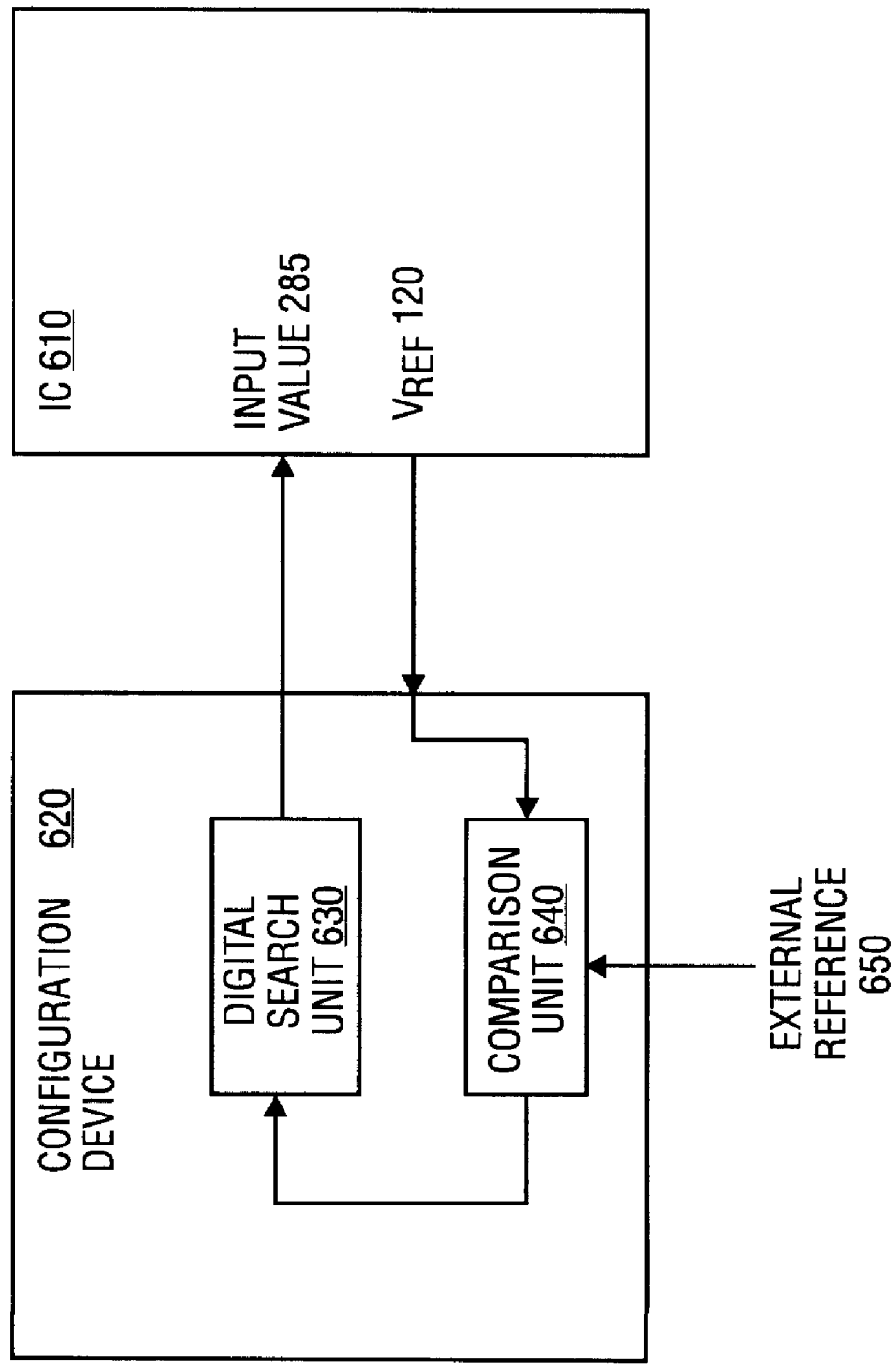
FIG. 6 illustrates one embodiment of a configuration device according to the teachings of the present invention.

FIG. 6 illustrates one embodiment of a configuration device 620 for configuring input value 285 for an integrated circuit 610 that produces a constant reference voltage 120. A similar device can be used to configure input value 285 to produce a constant current. In the illustrated embodiment, configure device 620 is a separate external device. In alternate embodiments, configuration device 620 can be on the same chip as integrated circuit 610.

Configuration device 620 includes comparison unit 640 to determine a signal variation for the reference voltage 120 in any number of ways such as those discussed above. In the illustrated embodiment, comparison unit 640 receives an external reference signal 650 to which the reference voltage 120 can be compared. In alternate embodiments, comparison unit 640 may merely compares reference voltage 120 to itself at more than one temperature.

Configuration device 620 also includes digital search unit 630. Based on the output of comparison unit 640, digital search unit 630 updates the input value 285. In alternate embodiments, any number of search techniques, such as those discussed above, can be used to update input value 285. When and if an acceptable signal variation is found, the input value is programmed into the integrated circuit 610.

The present invention can be used and/or performed in any number of hardware and/or software systems including a broad category of systems known in the art, such as a computer systems, set-top boxes, internet appliances, cellular phones, an virtually any other device that uses integrated circuits. For instance, in flash memory, constant signal generators can be used by charge pumps to generate more accurate signals for erasing and programming cells of flash memory. Also, cells of flash memory can store multiple bits of data per cell by programming analog voltage levels in each cell. The more accurately voltage levels can be programmed and read, the more voltage levels, and hence data, that can be stored per cell of flash memory.

Figure 7:
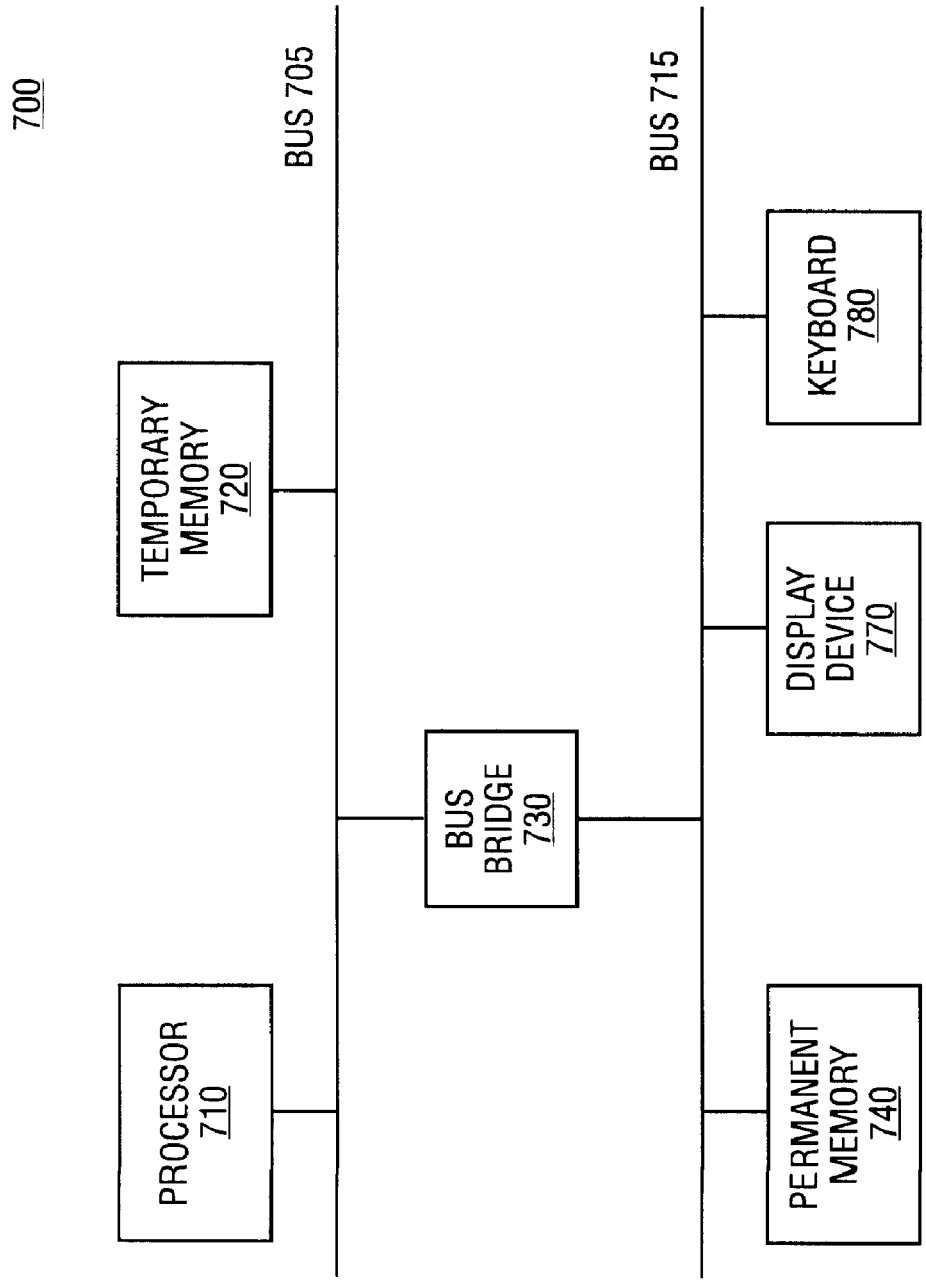
FIG. 7 illustrates one embodiment of a computer system according to the teachings of the present invention.

FIG. 7 illustrates one embodiment of a suitable hardware system for practicing the present invention. In the illustrated embodiment, the hardware system 700 includes processor 710 coupled to high speed bus 705, which is coupled to input/output (I/O) bus 715 through bus bridge 730. Temporary memory 720 is coupled to bus 705. Permanent memory 740 is coupled to bus 715. Display device 770 and keyboard 780 are also coupled to bus 715. Constant signal generators, such as 200A and 200B of FIG. 2, can be used through hardware system 700 for any number of purposes.

Certain embodiments may not require all of the above components, may include additional components, or may combine one or more components. For instance, temporary memory 720 may be on-chip with processor 710. Alternatively, permanent memory 740 may be eliminated and temporary memory 720 may be replaced with an electrically erasable programmable read only memory (EEPROM), such as flash memory, wherein software routines are executed in place from the EEPROM. Some implementations may employ a single bus to which all of the components are coupled. Additional components may include as additional processors, storage devices like a CD ROM, memories, and other peripheral components known in the art, and the additional components may be coupled to one or more additional buses through additional bus bridges.

In one embodiment, configuration device 620, as discussed above, is implemented as a series of software routines run by the hardware system of FIG. 7. These software routines comprise a plurality or series of instructions to be executed by a microprocessor in a hardware system, such as processor 710. Initially, the series of instructions can be stored on a storage device, such as permanent memory 740. Alternatively, as shown in FIG. 8, machine executable instructions 825, representing the functions of the present invention, could be stored on distribution storage medium 810, such as a CD ROM, a digital video or versatile disk (DVD), or a magnetic storage medium like a floppy disk or tape. The instructions could also be downloaded from a local or remote network server as a propagated signal through any of a number of mediums including wired connections, fiber optic connections, and wireless connections.

Alternately, the present invention could be implemented in any number of additional hardware machines or components to generate a constant signal or configure a constant signal generator. For instance, one or more ASICs (application specific integrated circuits) could be endowed with some or all of the functionality of the configuration, and inserted into system 700 of FIG. 7 as additional components not shown, or combined with one or more other components.

Thus, a constant current or voltage generator method and apparatus is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A signal generator in an integrated circuit, comprising:
    circuitry to generate an output signal based on a supply signal and a difference between a first reference value and a second reference value, wherein the output signal has an output signal variation due to at least one of a process variation, a temperature variation, and a variation in the supply signal;
    a first reference device to provide the first reference value based on an input signal;
    a second reference device to provide the second reference value based on the inputs signal; and
    a selectable resistor circuit coupled to the second reference device to reduce the output signal variation.

2. The signal generator of claim 1 wherein the signal generator is implemented in flash electrically erasable programmable read only memory (EEPROM) technology.

3. The signal generator of claim 1 wherein the process variation is due to manufacturing variation from one integrated circuit to another.

4. The signal generator of claim 1 wherein the source signal comprises one of a bandgap reference voltage and a current reference.

5. The signal generator of claim 1 further comprising:
a feedback loop to provide the output signal to the first and second reference devices as the input signal.

6. The signal generator of claim 1 wherein the first reference device comprises a diode, and wherein the temperature variation comprises a voltage decrease across the diode as temperature increases.

7. The signal generator of claim 1 wherein the second reference device comprises:
a diode, wherein the temperature variation comprises a voltage decrease across the diode as temperature increases;
a plurality of resistors coupled in parallel, wherein the plurality of selectable reference values comprise a different voltage increase across each of the plurality of resistors as temperature increases; and
logic to select one of the plurality of resistors coupled in parallel at a time to be active in the second reference device based on an input value.

8. The signal generator of claim 7 wherein the logic comprises content addressable memory (CAM) that is one-time-programmable based on the input value.

9. The signal generator of claim 7 wherein each of the plurality of resistors coupled in parallel comprises a different temperature coefficient.

10. The signal generator of claim 9 wherein at least one of the plurality of resistors coupled in parallel comprises a temperature coefficient substantially equal to an inverse of a reference temperature.

11. The signal generator of claim 7 wherein each of the plurality of resistors coupled in parallel comprises a first resistor component having a temperature coefficient higher than an inverse of a reference temperature and a second resistor component having a temperature coefficient lower than the inverse of the reference temperature.

12. The signal generator of claim 11 wherein the first resistor component comprises an N-well resistor and the second resistor component comprises a poly-1 resistor.

13. The signal generator of claim 1 further comprising:
a configuration device to supply an input value to select one of the plurality of reference values, said configuration device further to determine the output signal variation for the selected reference value, and repeatedly change the input value until the output signal variation is acceptably reduced.

14. The signal generator of claim 13 wherein the configuration device to determine the output signal variation is to at least one of:
compare the output signal to a nominal reference signal;
compare the output signal at a first temperature to the output signal at a second temperature; and
compare the output signal at the first temperature to the nominal reference signal and comparing the output signal at the second temperature to the nominal reference signal.

15. A configuration device comprising:
a search unit to supply an input value to a signal generator in a first integrated circuit to select one of a plurality of reference values to be used within the signal generator as a first reference value; and
a comparison unit to determine an output signal variation of an output signal generated by the signal generator, said signal generator to generate the output signal based on a supply signal and a difference between the first reference value and a second reference value, said signal variation due to at least one of a process variation, a temperature variation, and a variation in the supply signal;
said search unit and comparison unit to repeatedly change the input value and determine the output signal variation until the signal variation is acceptably reduced or the plurality of reference values are exhausted.

16. A method comprising:
supplying an input value to a signal generator in a first integrated circuit to select one of a plurality of reference values to be used within the signal generator as a first reference value;
determining an output signal variation of an output signal generated by the signal generator, said signal generator to generate the output signal based on a supply signal and a difference between the first reference value and a second reference value, said signal variation due to at least one of a process variation, a temperature variation, and a variation in the supply signal; and
repeatedly changing the input value, supplying the input value, and determining the output signal variation until the signal variation is acceptably reduced or the plurality of reference values are exhausted.

17. The method of claim 16 further comprising:
repeating the supplying, determining, and repeatedly changing for a plurality of additional integrated circuits.

18. The method of claim 16 further comprising:
supplying the input value to a plurality of additional integrated circuits if the signal variation for the first integrated circuit was acceptably reduced.

19. The method of claim 18 wherein the plurality of additional integrated circuits comprise integrated circuits from a same run of a manufacturing process as the first integrated circuit.

20. The method of claim 16 wherein determining an output signal variation comprises at least one of:
comparing the output signal to a nominal reference signal;
comparing the output signal at a first temperature to the output signal at a second temperature; and
comparing the output signal at the first temperature to the nominal reference signal and comparing the output signal at the second temperature to the nominal reference signal.

21. A system, comprising:
a bus;
a processor couple to the bus; and
a memory, coupled to the bus, to store a basic input output system (BIOS) for the processor and to include a signal source, wherein the signal source comprises:
circuitry to generate an output signal based on a supply signal and a difference between a first reference value and a second reference value, wherein the output signal has an output signal variation due to at least one of a process variation, a temperature variation, and a variation in the supply signal;
a first reference device to provide the first reference value based on an input signal;
a second reference device to provide the second reference value based on the inputs signal; and
a selectable resistor circuit coupled to the second reference device to reduce the output signal variation.

22. The system of claim 21 wherein the memory comprises a flash electrically erasable programmable read only memory (EEPROM).

23. A machine readable storage medium having stored thereon machine executable instructions, the execution of which to implement a method comprising:

supplying an input value to a signal generator in a first integrated circuit to select one of a plurality of reference values to be used within the signal generator as a first reference value;

determining an output signal variation of an output signal generated by the signal generator, said signal generator to generate the output signal based on a supply signal and a difference between the first reference value and a second reference value, said signal variation due to at least one of a process variation, a temperature variation, and a variation in the supply signal; and repeatedly changing the input value, supplying the input value, and determining the output signal variation until the signal variation is acceptably reduced or the plurality of reference values are exhausted.

* * * * *